United States Patent
Li et al.

(10) Patent No.: US 12,537,478 B2
(45) Date of Patent: Jan. 27, 2026

(54) SOFT SPACERS FOR SHINGLED SOLAR CELL PANELS

(71) Applicant: Maxeon Solar Pte. Ltd., Singapore (SG)

(72) Inventors: Ruihua Li, Cupertino, CA (US); Yafu Lin, San Jose, CA (US); Nicholas Eli Berry, Beaverton, OR (US)

(73) Assignee: Maxeon Solar Pte. Ltd., Singapore (SG)

(*) Notice: Subject to any disclaimer, the term of this patent is extended or adjusted under 35 U.S.C. 154(b) by 392 days.

(21) Appl. No.: 17/981,698

(22) Filed: Nov. 7, 2022

(65) Prior Publication Data

US 2023/0402968 A1  Dec. 14, 2023

Related U.S. Application Data

(60) Provisional application No. 63/351,100, filed on Jun. 10, 2022.

(51) Int. Cl.
*H02S 40/36* (2014.01)
*H02S 30/00* (2014.01)
*H10F 19/90* (2025.01)
*H10F 77/50* (2025.01)

(52) U.S. Cl.
CPC .............. *H02S 40/36* (2014.12); *H02S 30/00* (2013.01); *H10F 19/904* (2025.01); *H10F 19/906* (2025.01); *H10F 77/50* (2025.01)

(58) Field of Classification Search
CPC . H01L 31/05; H01L 31/0504; H01L 31/0508; H01L 31/0512; H02S 40/36; H02S 30/00; H02S 20/25; H10F 19/904; H10F 19/906; H10F 77/50; H10F 19/00
See application file for complete search history.

(56) References Cited

U.S. PATENT DOCUMENTS

| | | | |
|---|---|---|---|
| 2008/0121265 A1* | 5/2008 | Hishida | H01L 31/0201 136/244 |
| 2010/0084001 A1* | 4/2010 | Tsunomura | H01L 31/0747 136/244 |
| 2010/0288328 A1* | 11/2010 | Fukushima | H01L 31/022433 156/196 |
| 2013/0074903 A1* | 3/2013 | Tohoda | H01L 31/0508 438/66 |
| 2018/0367095 A1* | 12/2018 | Morad | H01L 31/0201 |
| 2021/0028222 A1* | 1/2021 | Chambion | H01L 27/14687 |

OTHER PUBLICATIONS

Web Material Specification Sheet for Polyurethane and Acrylic.*
MG Chemicals, "Silver Conductive Epoxy Adhesive Good Conductivity/Slow Cure 8331S Technical Data Sheet", Rev. Date: Mar. 29, 2016/Ver. 2.02, 7 pages.
West System Technical Data Sheet, "105 Epoxy Resin / 205 Fast Hardener", West System International, Rev 1, May 2016.

* cited by examiner

*Primary Examiner* — Angelo Trivisonno
(74) *Attorney, Agent, or Firm* — Schmidt Patent Law, Inc.

(57) ABSTRACT

A high efficiency configuration for a solar cell module comprises solar cells arranged in an overlapping shingled manner and conductively bonded to each other in their overlapping regions to form super cells, which may be arranged to efficiently use the area of the solar module. Solar cells are conductive bonded to each other with electrically conductive adhesive containing soft spacers.

12 Claims, 8 Drawing Sheets

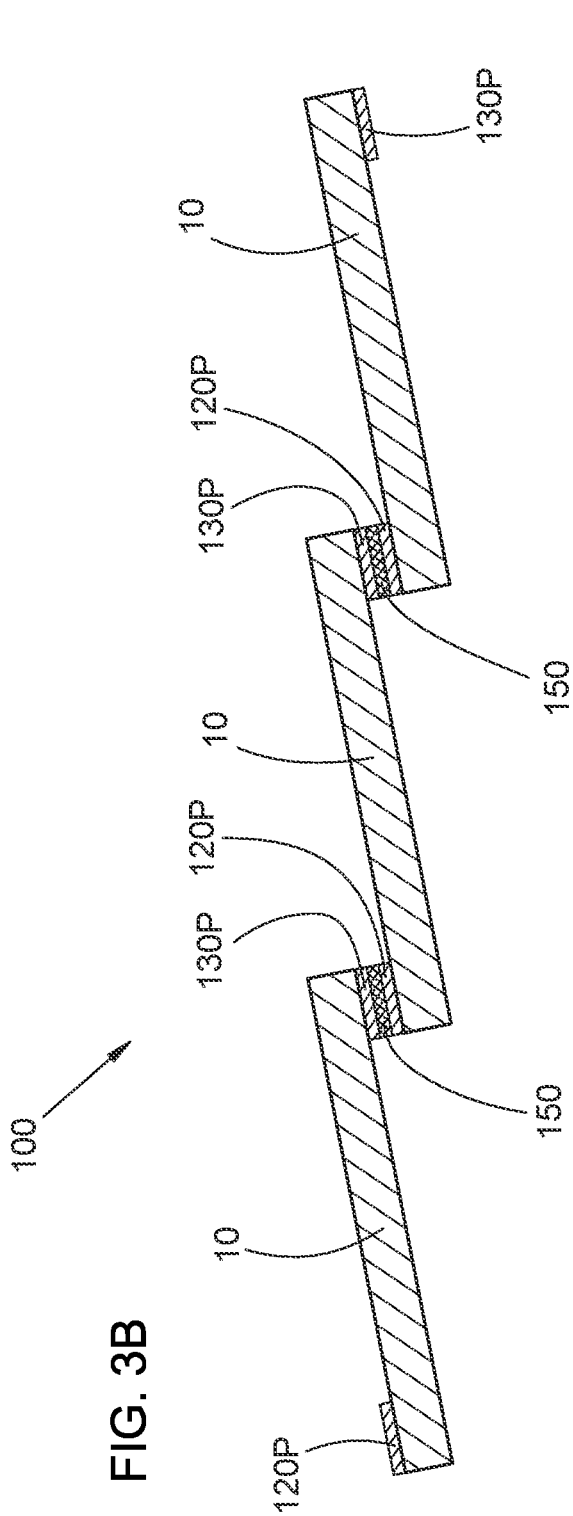
FIG. 3B
FIG. 8A
FIG. 8B

FIG. 6C
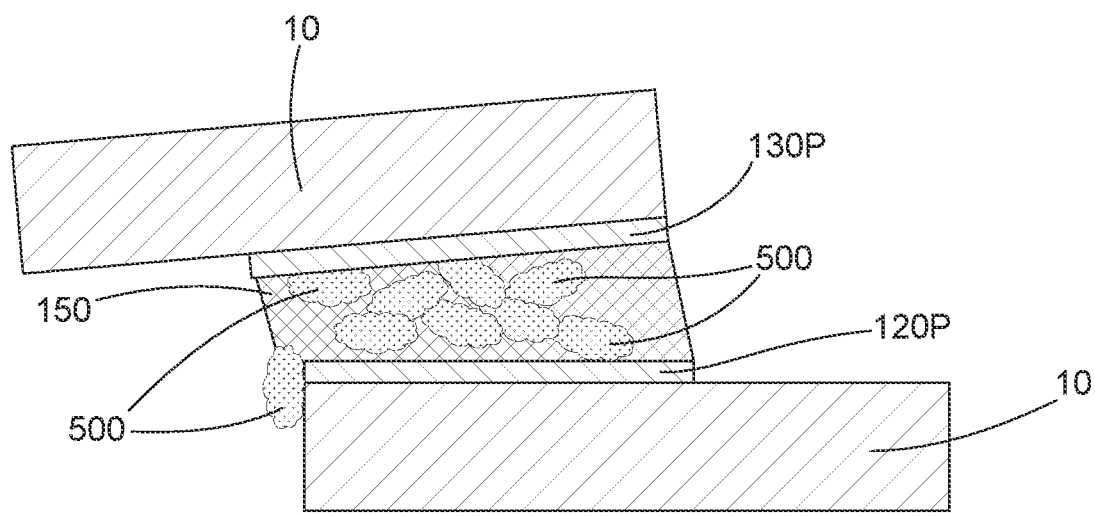
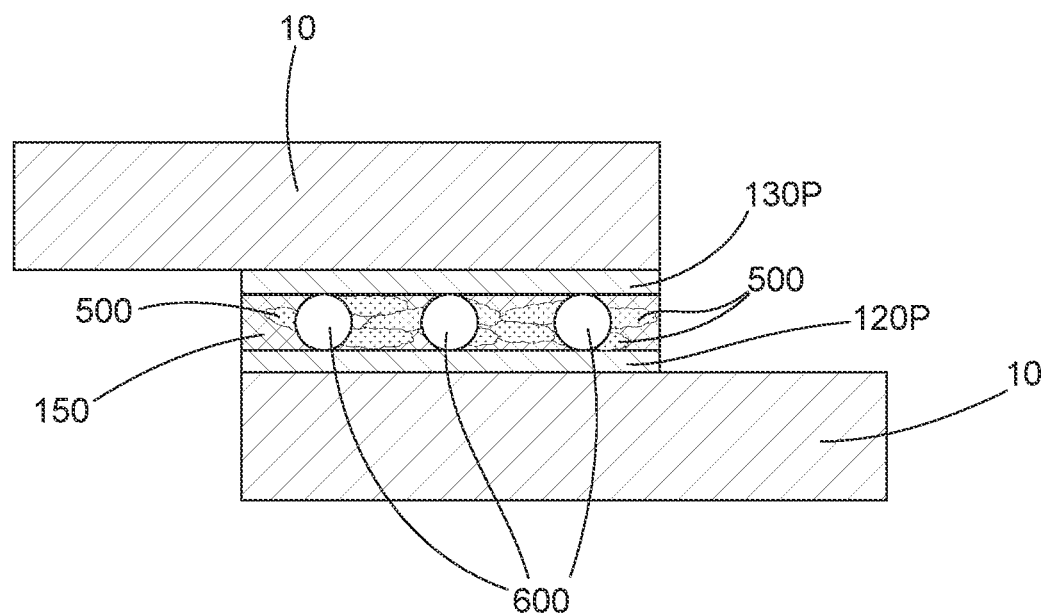
FIG. 7

SOFT SPACERS FOR SHINGLED SOLAR CELL PANELS

CROSS REFERENCE TO RELATED APPLICATIONS

This application claims benefit of priority to U.S. provisional application No. 63/351,100 filed Jun. 10, 2022, which is incorporated herein by reference in its entirety.

FIELD OF THE INVENTION

The invention relates generally to solar cell modules or panels in which the solar cells are arranged in a shingled manner.

BACKGROUND

Alternate sources of energy are needed to satisfy ever increasing world-wide energy demands. Solar energy resources are sufficient in many geographical regions to satisfy such demands, in part, by provision of electric power generated with solar (e.g., photovoltaic) cells.

Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to conductive regions on the solar cell to direct an electrical current from the cell to an external circuit. When solar cells are combined in an array such as a solar cell module, the electrical energy collected from all of the solar cells can be combined in series and parallel arrangements to provide power with a desired voltage and current.

SUMMARY

This specification discloses solar cell modules in which have crystalline silicon solar cells arranged in a shingled manner. The solar cells are bonded together using an electrically conductive adhesive containing soft spacers. Crystalline silicon solar cells bonded together using an electrically conductive adhesive containing hard spacers may cause the crystalline silicon solar cells to crack under pressure. The use of soft spacers in the electrically conductive adhesive is advantageous because it mitigates against solar cells cracking when pressure is applied to the solar module or panel. The use of soft spacers in the adhesive also creates a more even bond line thickness between solar cell which is advantageous for a number of reasons as discussed below.

Embodiments may include for example an apparatus comprising a string of solar cells. The string comprises a first and second rectangular or substantially rectangular crystalline silicon solar cells arranged in a shingled manner with long sides of the first and second solar cells overlapping and conductively bonded to each other with an electrically conductive adhesive. The first and second solar cells are electrically connected in series. Each solar cell comprises a front surface having a front metallization pattern comprising a plurality of conductive fingers electrically connected to a plurality of front contact pads. Each solar cell also comprises a rear surface having a rear metallization pattern comprising a plurality of rear contact pads. The electrically conductive adhesive comprises electrically conductive particles, a cured binder, and spacers. The electrically conductive adhesive bonds the front contact pads of the first solar cell to the rear contact pads of the second solar cell. The spacers in the electrically conductive adhesive establishes a minimum distance between the front contact pad and the rear contact pad. The spacers are electrically conductive and have an electrical conductivity greater than $1 \times 10^{-10}$ S/m.

In some embodiments, the spacers have a Young's modulus less than or substantially equal to a Young's modulus of the cured binder.

In some embodiments, the spacers have a Young's Modulus between 0.1 and 35 GPa.

In some embodiments, the spacers have a Young's Modulus between 6 and 35 GPa.

In some embodiments, the spacers have a melting temperature greater than 50° C.

In some embodiments, the spacers have a melting temperature greater than 100° C.

In some embodiments, the spacers have a melting temperature greater than 150° C.

In some embodiments, the spacers have a melting temperature greater than 200° C.

In some embodiments, the cured binder is a cured epoxy.

In some embodiments, the electrically conductive particles in the electrically conductive adhesive comprise silver.

In some embodiments, the spacers have a size distribution with a coefficient of variation of a thickness of the spacers that is less than 5%.

In some embodiments, the weight of the spacers is between 2% and 5% the weight of the electrically conductive adhesive.

In some embodiments, the spacers have a core-shell configuration where the core comprises a first material and the shell comprises a different second material.

In some embodiments, the shell material comprises silver.

In some embodiments, the core material comprises a plastic material.

These and other embodiments, features and advantages of the present invention will become more apparent to those skilled in the art when taken with reference to the following more detailed description of the invention in conjunction with the accompanying drawings that are first briefly described.

BRIEF DESCRIPTION OF THE DRAWINGS

The figures described below depict various aspects of the system and methods disclosed herein. Each figure depicts an embodiment of a particular aspect of the disclosed system and methods, and that each of the figures is intended to accord with a possible embodiment thereof. Further, wherever possible, the following description refers to the reference numerals included in the following figures, in which features depicted in multiple figures are designated with consistent reference numerals.

FIGS. 3A-3B show a string of series-connected solar cells arranged in a shingled manner with long sides of adjacent solar cells overlapping to form a super cell. FIG. 3A shows a front surface view of the string of solar cells. FIG. 3B shows a cross-sectional view of the string of solar cells taken from line A-A in FIG. 3A.

FIGS. 6A, 6B, and 6C illustrate the consequences of over-pressing (FIG. 6A), insufficient pressing (FIG. 6B), and uneven pressing (FIG. 6C) of the solar cells during the process for bonding two cells together.

FIG. 7 shows two solar cells bonded together using an electrically conductive adhesive containing spacers.

FIGS. 8A-8B show cross-sectional views of two types of spacers.

DETAILED DESCRIPTION

Figure 1A:
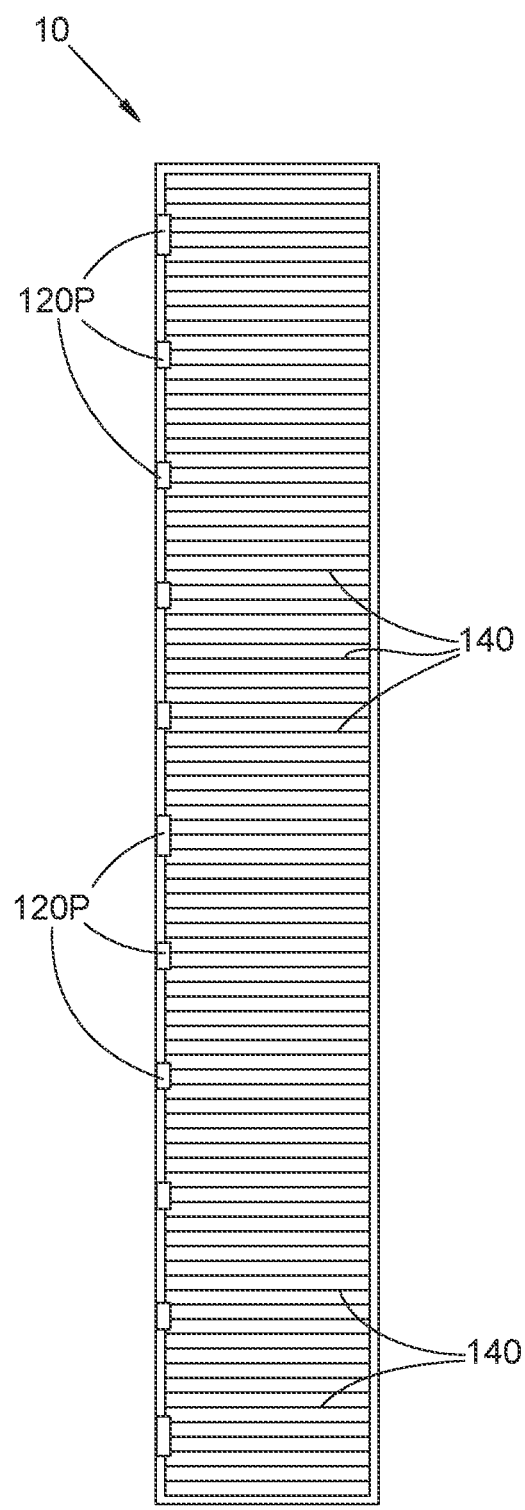
FIGS. 1A-1B show an example rectangular solar cell with example front surface metallization pattern (FIG. 1A) and example rear surface metallization pattern (FIG. 1B).

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

As used in this specification and the appended claims, the singular forms "a," "an," and "the" include plural referents unless the context clearly indicates otherwise. Also, the term "parallel" is intended to mean "substantially parallel" and to encompass minor deviations from parallel geometries. The term "perpendicular" is intended to mean "perpendicular or substantially perpendicular" and to encompass minor deviations from perpendicular geometries rather than to require that any perpendicular arrangement described herein be exactly perpendicular. The term "square" is intended to mean "square or substantially square" and to encompass minor deviations from square shapes, for example substantially square shapes having chamfered (e.g., rounded or otherwise truncated) corners. The term "rectangular" is intended to mean "rectangular or substantially rectangular" and to encompass minor deviations from rectangular shapes, for example substantially rectangular shapes having chamfered (e.g., rounded or otherwise truncated) corners or may have non-linear edges. The term "identical" is intended to mean "identical or substantially identical" and to encompass minor deviations in shape, dimensions, structure, composition, or configuration, for example.

This specification discloses high-efficiency solar modules (also referred to herein as solar panels) comprising crystalline silicon solar cells arranged in an overlapping shingled manner and electrically connected in series by conductive bonds between adjacent overlapping solar cells to form super cells, with the super cells arranged in physically parallel rows in the solar module. Shingled solar cells efficiently use the area of the solar module, reduce series resistance, and increase module efficiency. For example, in traditional ribbon-connected solar cells, an electrically conductive ribbon is used to connect the back metal busbars of a solar cell with the front metal busbars of an adjacent solar cell. This connection requires a gap between solar cells to accommodate ribbons used for connecting adjacent solar cells. However, the interconnect ribbons connecting the front surface of a solar cell often block sunlight to the solar cell reducing the active illuminated area of the solar cell and the gaps between solar cells reduce the area in the solar module that can be used to generate electrical power. With shingled solar cells, solar cells are directly connected to each other in an overlapping manner with no gaps between cells and no ribbons. Without gaps between the solar cells, the area within a shingled solar module is better utilized for electrical power generation, i.e. the gap area that was needed to make the front-to-back connection can now be used for electrical power generation.

A super cell may comprise any suitable number of solar cells. The super cells may have lengths spanning essentially the full length or width of the solar module, for example, or two or more super cells may be arranged end-to-end in a row. A shingled arrangement hides solar cell-to-solar cell electrical interconnections and increases the efficiency and the aesthetic attractiveness of the module. For example, in a shingled arrangement the busbars on the front surface of the solar cells are not visible since the busbar are hidden from view by an adjacent solar cell. Also, interconnecting ribbons which may detect from the aesthetics of the solar module are not used. Busbars and ribbons and other type of circuitry can detract from the aesthetics of the solar module, especially for use in the home or residential setting.

Shingled solar cells also have less ohmic losses compared with traditional ribbon-connected solar cell. Shingled solar cells have a much shorter interconnect distance than traditional ribbon connected solar cells. For example, the bonding distance between shingled solar cells may be 50 microns compared to a ribbon interconnect length of approximately two times the length of a solar cell. The much shorter interconnect distance of shingled solar cells results in lower ohmic losses and increased efficiency.

In the examples described in this specification, each solar cell is a crystalline silicon solar cell having front (sunny side) surface and rear (shaded side) surface metallization patterns providing electrical contact to opposite sides of an n-p junction, the front surface metallization pattern is disposed on a semiconductor layer of n-type conductivity, and the rear surface metallization pattern is disposed on a semiconductor layer of p-type conductivity. However, other material systems, diode structures, physical dimensions, or electrical contact arrangements may be used if suitable. For example, the front (sunny side) surface metallization pattern may be disposed on a semiconductor layer of p-type conductivity, and the rear (shaded side) surface metallization pattern disposed on a semiconductor layer of n-type conductivity.

FIG. 1A shows a front surface view, i.e. viewed from the sunny side of the solar cell, of example rectangular crystalline silicon solar cell 10 having a front surface metallization pattern comprising a plurality of front contact pads 120P which may be made of silver or some other conductive material. The plurality of front contact pads 120P are situated near one of the long edges of the solar cell, spaced apart from each other along that long edge of the solar cell, and connected together by a thin strip of conductive material, e.g. by a bus bar. FIG. 1A further shows the front surface metallization of crystalline silicon solar cell 10 comprising a plurality of conductive fingers 140 oriented parallel to the short edge of the solar cell to form a comb-like conductive structure. Conductive fingers 140 are electrically connected to the front contact pads 120P and collect current from throughout the front surface of solar cell 10.

Figure 1B:
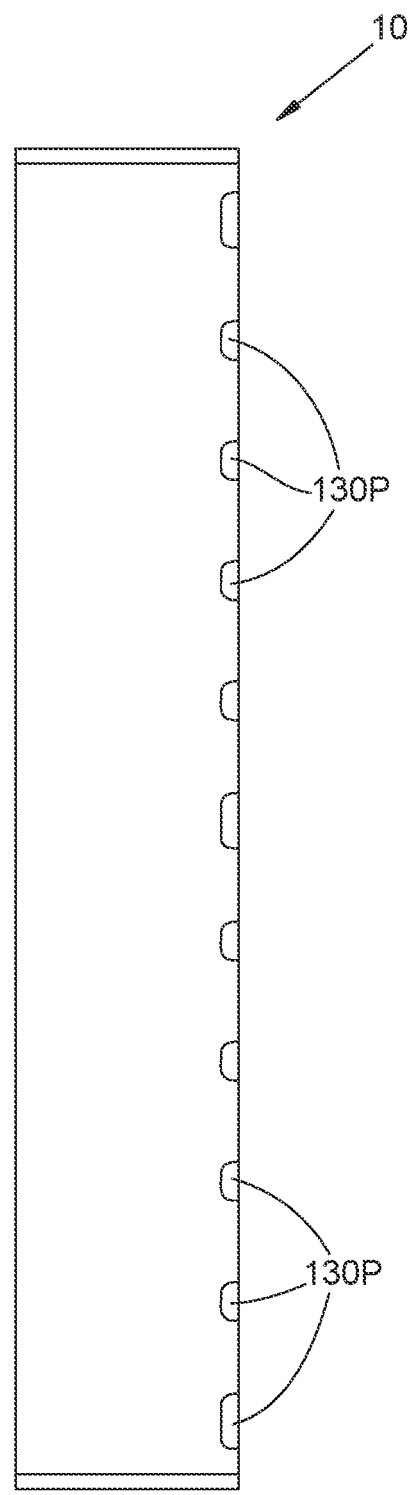

FIG. 1B shows a rear surface view, i.e. viewed from the shade side of the solar cell, of rectangular crystalline silicon solar cell 10 having a rear surface metallization pattern comprising a plurality of rear contact pads 130P which may be made of silver or some other conductive material. The plurality of rear contact pads 130P are situated near the opposite long edge from the edge near which the plurality of front contact pads 120P are situated, i.e. the rear contact pads 130P are situated near a different long edge from which the front contact pads 120P are situated near. In a similar fashion to the front contact pads, the plurality of rear contact pads 130P are spaced apart along the long edge of solar cell 10.

Figure 2A:
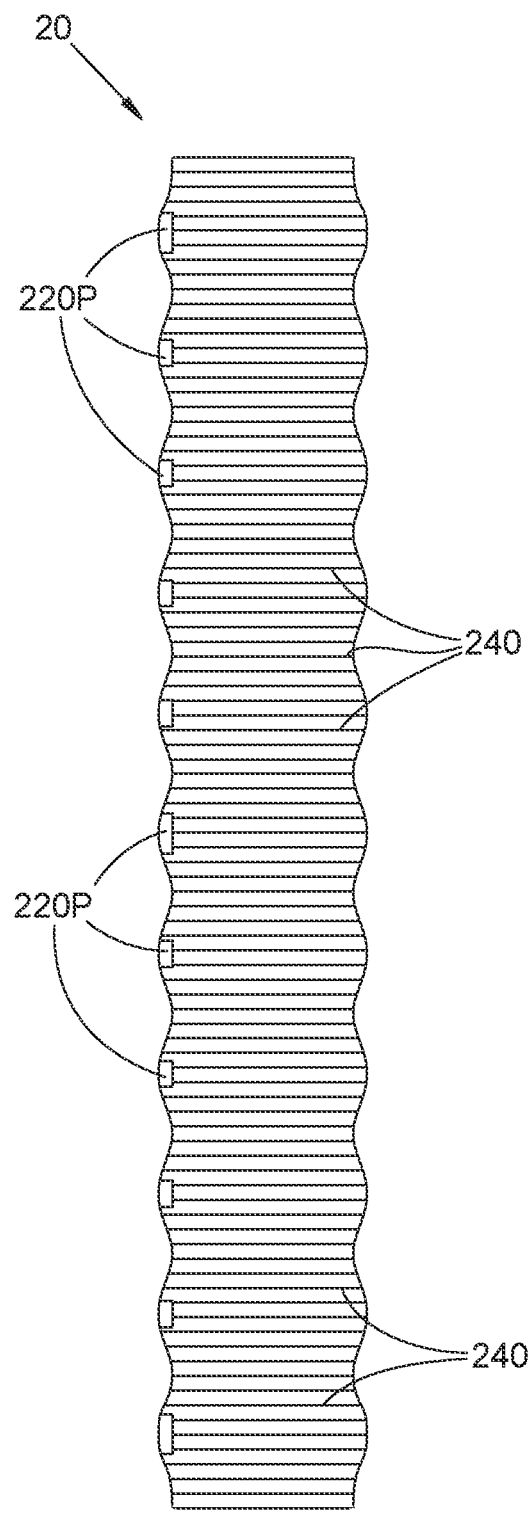
FIGS. 2A-2B show an example substantially rectangular solar cell with example front surface metallization pattern (FIG. 2A) and example rear surface metallization pattern (FIG. 2B).

FIG. 2A shows a front surface view of a substantially rectangular crystalline silicon solar cell 20 having non-linear long edges. The front surface metallization pattern of solar cell 20 comprises a plurality of front contact pads 220P which may be made of silver or some other conductive material. The plurality of front contact pads 220P are situated near one long edge of the solar cell, spaced apart from each other along that long edge of the solar cell, and connected together by a thin strip of conductive material (not shown). The non-linear edges have protruding portions, which are portions of the solar cell that protrude or extend away from a center of the solar cell, and recessing portions, which are portions of the solar cell that recess towards the center of the solar cell. The front contact pads 220P are located in the protruding portions of the solar cell. FIG. 2A further shows a plurality of conductive fingers 140 oriented parallel to the short edge of the solar cell to form a comb-like conductive structure. Conductive fingers 240 are electrically connected to front contact pads 220P and collect current from throughout the front surface of solar cell 20.

Figure 2B:
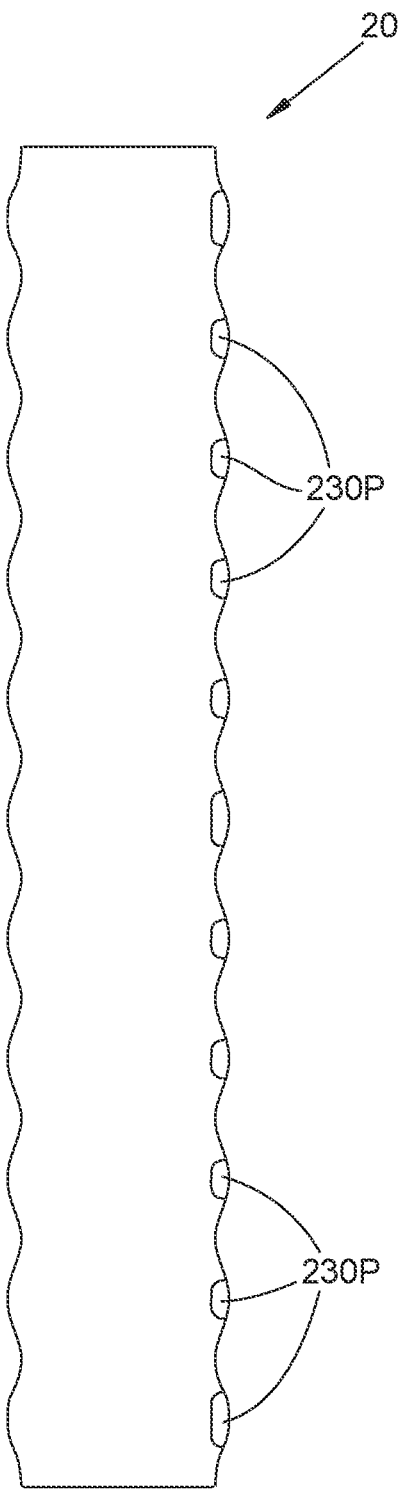

FIG. 2B shows a rear surface view of crystalline silicon solar cell 20 having non-linear long edges. The rear surface metallization pattern of solar cell 20 comprises a plurality of rear contact pads 230P which may be made of silver or some other conductive material. The plurality of rear contact pads 230P are situated near the long edge opposite from the edge near which the plurality of front contact pads 220P are situated. In a similar fashion to the front contact pads, the plurality of rear contact pads 230P are spaced apart along the long edge of solar cell 20 and are located in the protruding portions of the solar cell.

Multiple solar cells 10 may be connected together in series in a shingled manner with the long ends of adjacent solar cells overlapping and electrically connected to form a super cell. Similarly, multiple solar cells 20 may be connected together in series in a shingled manner with the long ends of adjacent solar cells overlapping and electrically connected to form a super cell. Although, this specification mainly illustrates solar cells 10 bonded together to form super cell, the following examples and embodiments apply equally to the substantially rectangular solar cells 20.

Figure 3A:
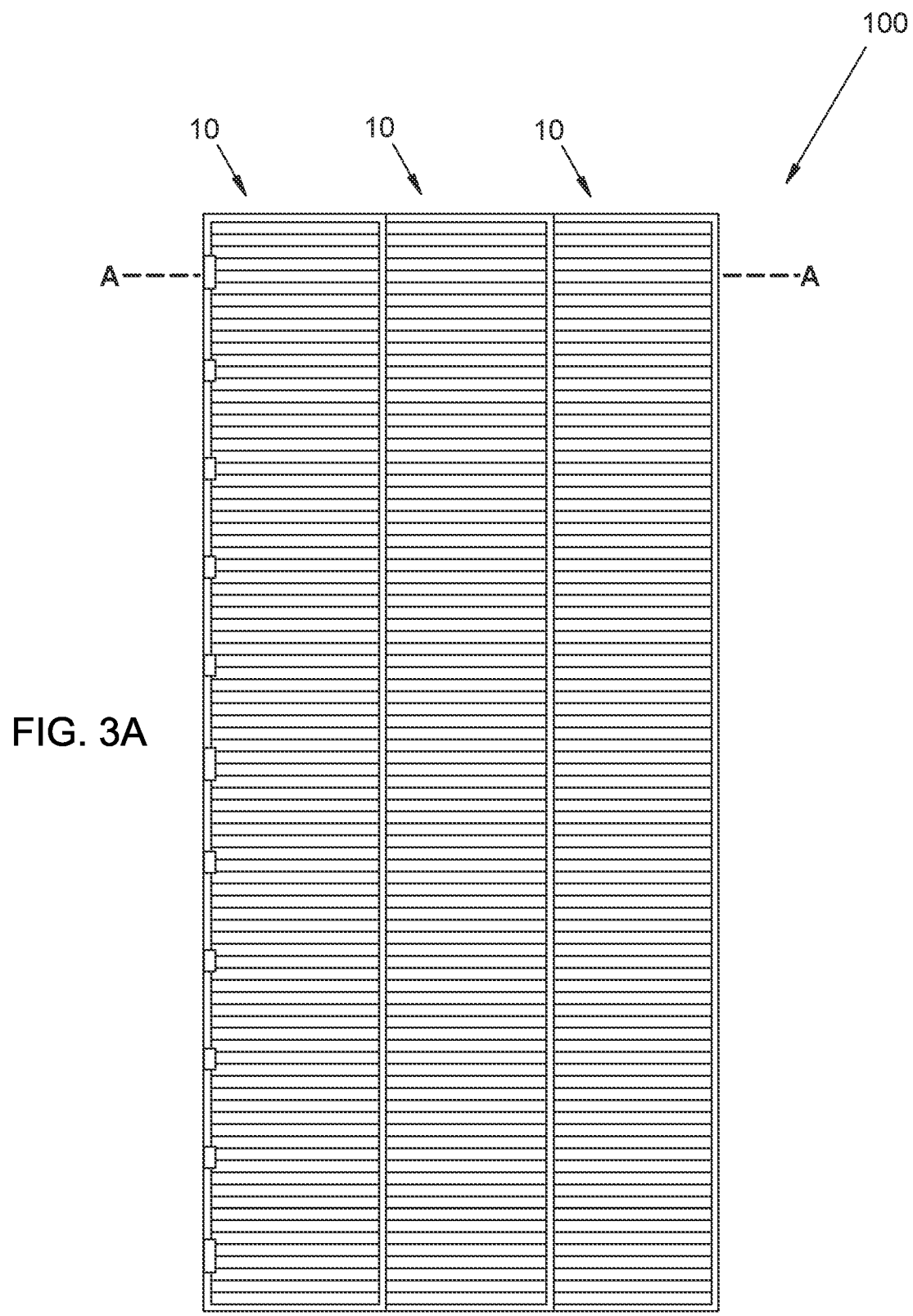

Each solar cell 10 comprises a semiconductor diode structure and electrical contacts to the semiconductor diode structure by which electric current generated in solar cell when it is illuminated by light may be provided to an external load. FIG. 3A shows a front surface view of the front (sunny side) surface of a string of series-connected solar cells 10. FIG. 3B shows a cross-sectional view of the string of series-connected solar cells 10 through line A-A in FIG. 3A. FIGS. 3A and 3B show solar cells 10 arranged in a shingled manner. This string of series connected solar cells form super cell 100. Although FIGS. 3A and 3B show a string of rectangular solar cells 10, solar cells 20 with non-linear edges can be shingled in a similar manner. For solar cells 20, the protruding portions of one solar cell will match with protruding portions of an adjacent solar cell. As such, the contact pads provided in the protruding portions of the solar cells match or line up (e.g., in a row) and can be electrically connected with a conductive adhesive bonding material in a manner similar to the depictions in FIGS. 3A and 3B.

FIG. 3B shows a cross-sectional view of solar cells connected to adjacent solar cells in a shingled manner. The leftmost solar cell in FIG. 3B is connected to the center solar cell via rear contact pad 130P. The center solar cell is connected to the leftmost solar cell via front contact pad 120P. The two contact pads 120P and 130P are bonded together by electrically conductive adhesive 150. While FIG. 3B shows one connection point between two adjacent solar cells, each solar cell is connected to an adjacent solar cell through multiple connection points. For example, if solar cell 10 had twenty front and rear contact pads, then solar cell 10 would have twenty connection points with its adjacent solar cell.

Electrically conductive adhesive 150 comprises electrically conductive particles, a binder component, and spacers. The electrically conductive particles, e.g. silver flakes, makes the adhesive electrically conductive. Other electrically conductive materials may be used in the adhesive such as copper, silver alloys, copper alloys, silver coated copper, or a silver-copper hybrid. The binder component may be an epoxy, acrylate, silicone, or polyurethane and so on. An epoxy binder can either be a one or two-part epoxy. One-part epoxies are normally heat cured, but with curing temperatures generally far below temperatures used for soldering. Two-part epoxies comprise a resin and a hardener. The cure temperatures and cure times depend on the composition of binder component. For example, binder components may be chosen so that the electrically conductive adhesive has a curing time of less than two minutes allowing for in-line processing and exceptionally high production throughput manufacturing of solar modules. The use of electrically conductive adhesive is advantageous compared with soldering. The use of a lower cure temperature as compared with solder reflow temperature results in less stress on the solar cell and reduction in bowing of the solar cell.

Figure 4:
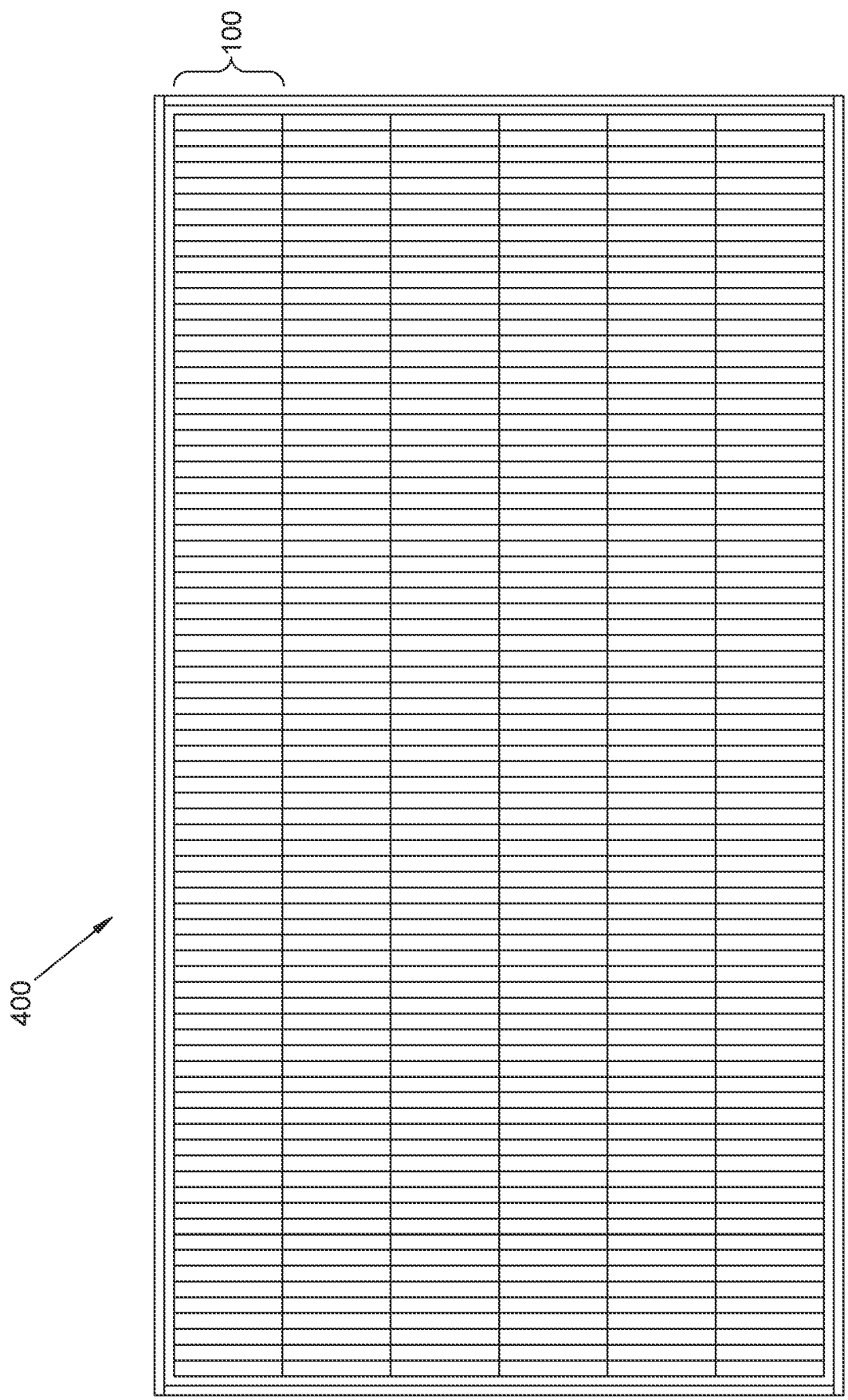
FIG. 4 shows the front surface of an example rectangular solar module comprising a plurality of rectangular shingled super cells, with the long side of each super cell having a length of approximately the full length of the long side of the module. The super cells are arranged with their long sides parallel to the long sides of the module.

FIG. 4 shows a front surface view of an example rectangular solar module 400 comprising six super cells 100, each supercell containing approximately eighty solar cells 10. Each super cell 100 may contain any number of solar cells, preferably between 50 and 100 solar cells. Each super cell 100 has a length approximately equal to the length of the long sides of the solar module. In this example super cells 100 are arranged as six parallel rows with their long sides oriented parallel to the long sides of the module. A similarly configured solar module may include more or fewer rows of such side-length super cells than shown in this example. In other variations the super cells may each have a length approximately equal to the length of a short side of a rectangular solar module, and be arranged in parallel rows with their long sides oriented parallel to the short sides of the module. In yet other arrangements each row may comprise two or more super cells, which may be electrically interconnected in series for example. The modules may have short sides having a length, for example, of about 1 meter and long sides having a length, for example, of about 1.5 to about 2.0 meters. Any other suitable shapes (e.g., square) and dimensions for the solar modules may also be used. Super cell 100 may comprise any suitable number of rectangular solar cells 10 of any suitable dimensions. Similarly, a row of super cells may comprise any suitable number of rectangular solar cells of any suitable dimensions arranged in one or more super cells.

Figure 5:
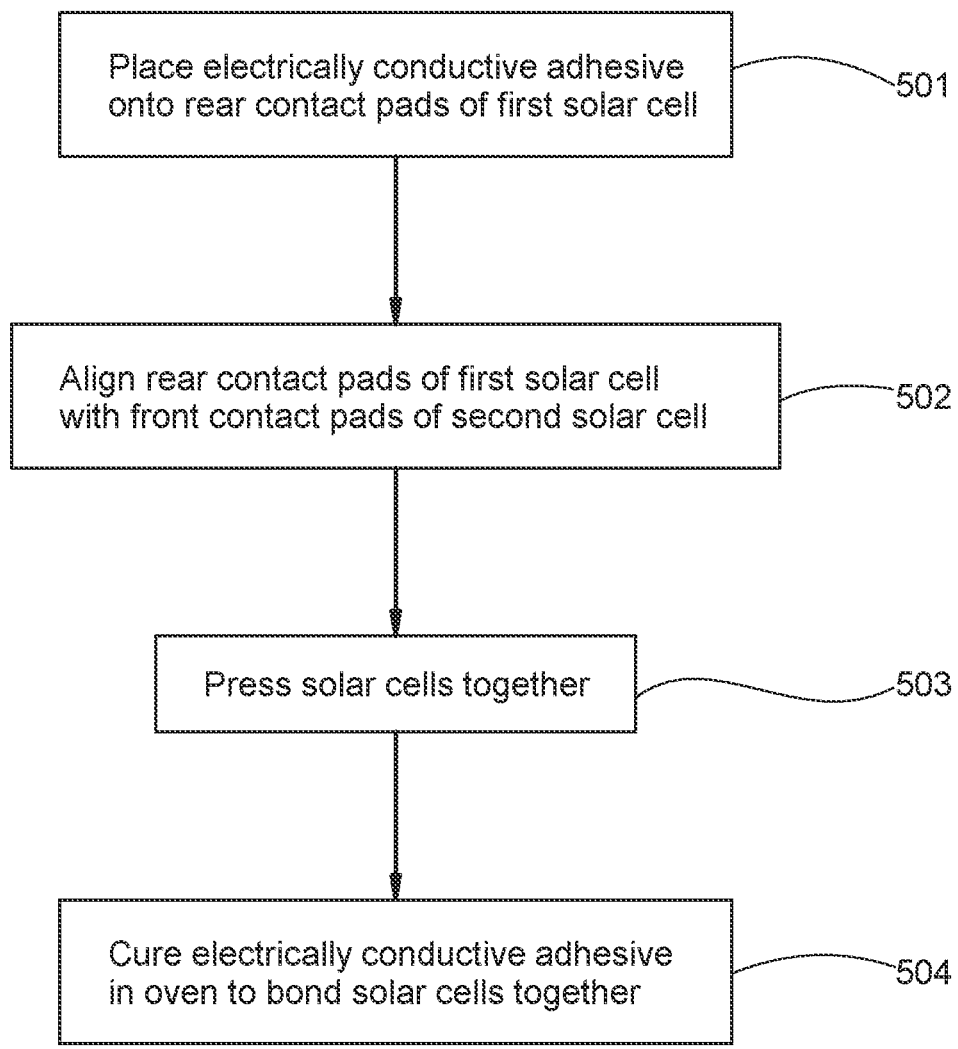
FIG. 5 depicts an example method of bonding two solar cells together to form shingled solar cells.

FIG. 5 is a block diagram showing steps for bonding a first solar cell to a second solar cell to form a string of shingled solar cells. In step 501, electrically conductive adhesive is placed on the rear contact pads of a first solar cell. Preferably, the electrically conductive adhesive is placed only on the contact pads of a solar cell and not on other areas of the solar cell. Next, in step 502, the rear contact pads of the first solar cell are aligned with the front contact pads of a second solar cell and the cells are arranged in a shingled manner. Next, in step 503, the first and second solar cells are pressed together so that the electrically conductive adhesive is in contact with both a front contract pad of the first solar cell and a corresponding rear contact pad of the second solar cell. Finally, the assembly is placed in an oven to cure the electrically conductive adhesive which bonds the contact pads together and thereby bonds the two solar cells together (step 504).

Figure 6A:
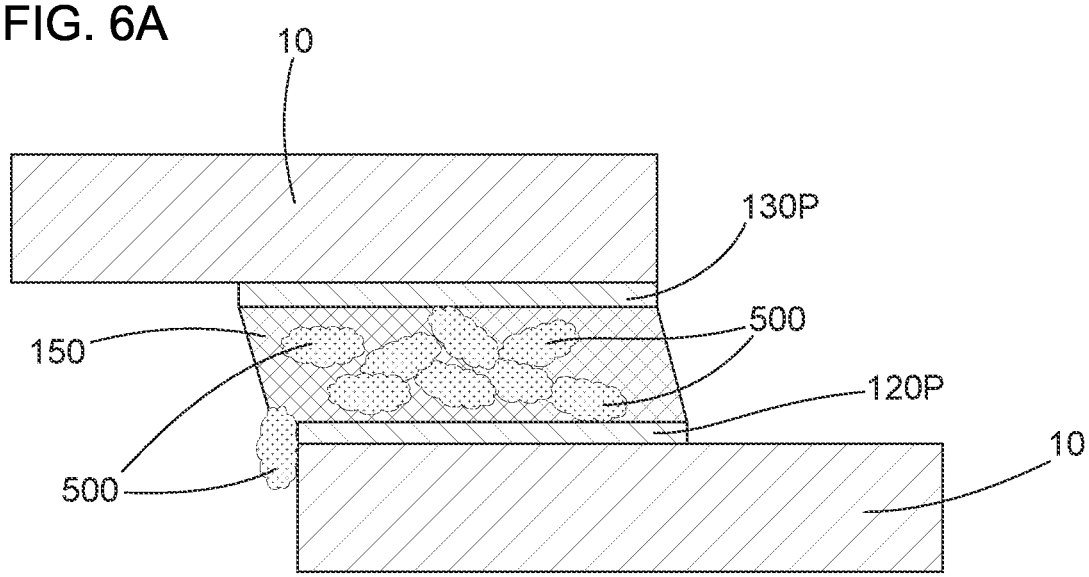
Figure 6B:
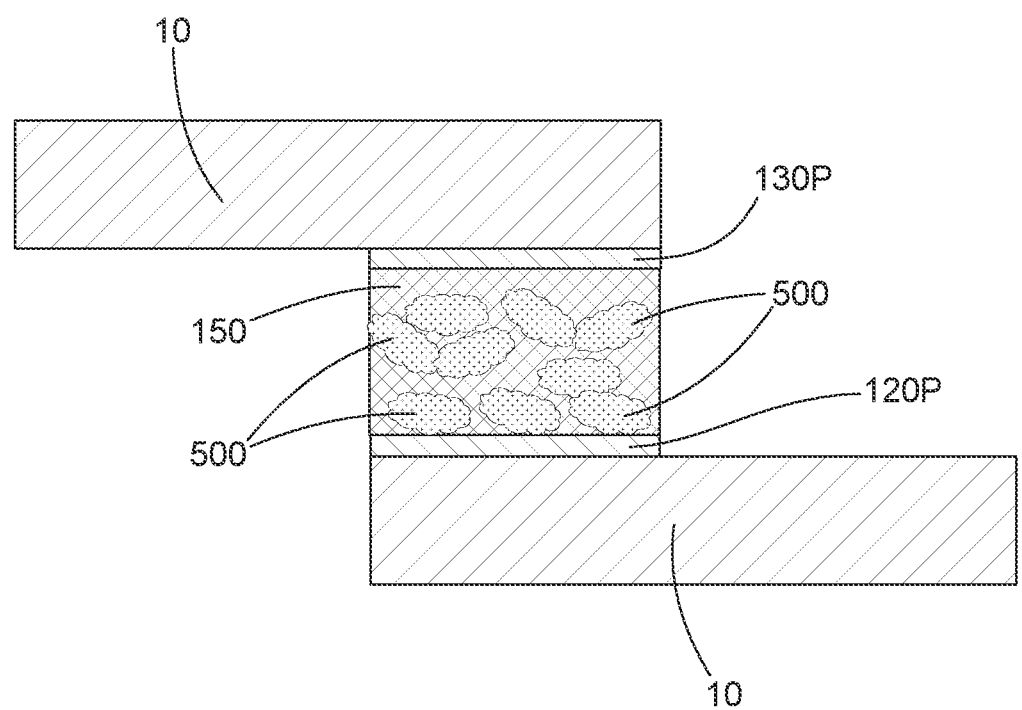

Referring to step 503 in FIG. 5, when the solar cells are pressed together, certain difficulties may arise. FIG. 6A shows the result of over-pressing electrically conductive adhesive 150 between contact pads 120P and 130P during assembly of solar cells 10. As shown in FIG. 6A, over-pressing may cause the electrically conductive adhesive containing silver flakes 500 to flow over the edge of the bottom solar cell and cause shunting of the bottom solar cell. FIG. 6B illustrates solar cells 10 that are not sufficiently pressed. This may result in an insufficient bond between the solar cells which negatively impacts the structural integrity of the greater super cell. FIG. 6C shows the result of unevenly pressing the electrically conductive adhesive. Unevenly pressing the electrically conductive adhesive may result in both shunting of the solar cell due to electrically conductive adhesive flowing over the edge of the solar cell and insufficient bonding between the solar cells.

These potential difficulties may be mitigated with the use of spacers in the electrically conductive adhesive. FIG. 7 shows electrically conductive adhesive 150 with spacers 600 dispersed within the adhesive used to bond two solar cells together. The spacers are preferably substantially spherical in shape although other spacer geometries can be used. The electrically conductive adhesive may contain up to and including 20% by mass of spacers. Preferably the electrically conductive adhesive contains between 2% and 10% by mass of spacers. The thickness of the spacer, or diameter in case of spherical spacers, is for example about 50 microns. A preferred thickness range of the spacers is between 40 and 60 microns. More preferred thickness of the spacer is 45-55 microns. Most preferred thickness range is 49-51 micron. The spacers must have a thickness of at least 20 microns to ensure adequate amount of adhesive binder is present between the contact pads to form a sufficient bond. The spacers preferably have an even size distribution, e.g. a size distribution with a coefficient of variation of the thickness of the spacers less than 10%. The presence of spacers within the electrically conductive adhesive mitigates over-pressing the electrically conductive adhesive because the thickness of the spacers defines a minimum distance between the contact pads of the solar cells. That is, with sufficient pressing, the spacers should be in contact with the front contact pads of one solar cell and in contact with the rear contact pads of an adjacent solar cell. Once the spacer is in contact with both contact pads, further pressing and therefore further decease in the distance between the contact pads is avoided. The presence of spacers within the electrically conductive adhesive also mitigates against not sufficiently pressing the adhesive because greater pressing pressure may be employed without fearing the consequences of over-pressing. The presence of spacers within the electrically conductive adhesive also mitigates against uneven pressing because the even size distribution of the spacers helps to define an even thickness of adhesive between the contact pads of adjacent solar cells.

In one embodiment, the spacers are composed of a soft material as shown in FIG. 8A. Soft spacers are preferred because the use of hard spacers, such as glass spacers, tends to crack the solar cells when pressure is applied to the solar module since the crystalline silicon solar cells within the solar module are relatively brittle. For example, the solar cells in a solar module tend to crack under snow loading or high wind if hard spacers are used. In another example, the solar cells tend to crack during solar panel installation if hard spacers are used. During installation, solar cell panels may be stacked on top of other another or workers may step on the solar cell panels. Use of hard spacers leads to more cracked solar cells during installation as compared to use of soft spacers. To minimize cracking of solar cells, the spacers may be as soft as the binder material used in the electrically conductive adhesive when the binder is cured, i.e. the Young's modulus of the spacers is less than or approximately equal to the Young's modulus of the cured binder. Young's modulus is a measure of the hardness or softness of the material. Materials with a higher Young's modulus are relatively harder than materials with a lower Young's modulus. The spacers preferably have a Young's Modulus between 0.1 and 35 Giga-Pascals (GPa), and most preferably between 6 and 35 GPa.

The spacers preferably comprise an electrically conductive material, i.e. a material with a Siemens per meter (S/m) greater than $1 \times 10^{-10}$. The use of electrically conductive spacers is preferable to increase the overall electric conductivity of the adhesive material and decrease Ohmic losses when current flows through the electrically conductive adhesive. Using spacers comprising an insulating material, i.e. glass spacers, increases the resistance of the adhesive material and makes for a less efficient electrically conductive adhesive. Further, too much insulating material in the adhesive is a fire risk. The insulating material may make the resistance of the adhesive high enough to burn or melt the solar cells when the solar module is operating.

The spacers preferably have a higher melting point temperature than the curing temperature used to cure the binder material so that spacers do not melt when the electrically conductive adhesive is cured. The higher the melting temperature of the spacers, the higher the curing temperature that can be used to cure the adhesive binder. The curing temperature of heat cured binder material can range of 50° C. to 300° C. The curing temperature of the binder material is preferably between 100° C. and 200° C. and most preferably between 150° C. and 200° C. The generally high preferred curing temperatures allows for faster curing times, which is preferred. Preferably, the melting temperature of the spacers is above the curing temperature used to cure the binder material in the adhesive. Therefore, the melting temperature of the space should generally be above 50° C. if a heat cured binder material is used, preferably the melting temperature is above 100° C., more preferably the melting temperature is above 150° C., and most preferably the melting temperature is above 200° C.

TABLE 1

| Spacer or Spacer Material | Young's Modulus (GPa) | Conductivity (S/m) | Melting Temp (° C.) |
|---|---|---|---|
| Silver | 85 | $6.3 \times 10^7$ | 962 |
| Copper | 130 | $5.96 \times 10^7$ | 1085 |
| Polymethyl methacrylate (PMMA) | 3.3 | Insulator | 160 |
| Tin | 50 | $9.17 \times 10^6$ | 232 |
| Lead | 16 | $4.55 \times 10^6$ | 327 |
| Glass | 70 | Insulator | 1400-1600 |
| Solder (Sn63/Pb37) | 31.5 | $7.2 \times 10^6$ | 183 |
| Silicone | 0.001-10 | Insulator | Not applicable |
| Polypropylene | 1 | Insulator | 160 |

Table 1 above is list of various materials and their reported melting temperature, conductivity, and Young's modulus values. Spacers made from lead may be suitable because lead is soft (Young modulus of 16 GPa), is conductive, and has a relatively high melting temperature.

FIGS. 8A and 8B illustrate alternate embodiments of the spacers. FIG. 8A shows a spacer 600 that comprises the same material throughout the spacer. For example, spacer 600 may comprise only lead. In another example, spacer 600 may consist of an alloy of metals. Alternatively, the spacer may comprise a core of material surrounded by a shell of a different material. FIG. 8B shows a cross-sectional view of a spherical spacer 600 consisting of a core 801 surrounded by shell 802. Shell 802 is composed of material different from the core material. For example, spacer 600 may have a core composed of PMMA or polypropylene material surrounded by a shell of silver material or of some other electrically conductive material.

The advantage of using a core-shell spacer is that a wider range of materials may be used to construct the spacers. For example, a spacer composed of only PMMA or polypropylene would be soft enough to be used as a spacer but might not be conductive enough. On the other hand, a spacer composed of only silver would be conductive enough to be used as a spacer but might not be soft enough. Combining the two materials in a core-shell configuration provides a spacer that is soft enough and conductive enough to be used as a spacer in the electrically conductive adhesive. The softness of this silver-coated PMMA spacer or silver-coated polypropylene spacer may be adjusted by changing the thickness of the silver shell. A greater thickness of the silver shell makes for a harder spacer overall. In general, the use of plastic materials works well as a core material which can be surrounded by a conductive metal shell, such as a shell made from silver.

In one embodiment, core 801 of the spacer is composed of a cured binder material. For example, if the electrically conductive adhesive uses acrylate as a binder, then the spacer may consist of a core 801 made from cured acrylate and a thin silver shell 802. The use of cured binder material for the core guarantees that the spacer will have a Young's modulus approximately equal to the Young's modulus of the cured binder in the adhesive since they are the same material. The Young's modulus of the spacer will be approximately equal to the Young's modulus of the cured binder because a thin silver shell only insubstantially increases the Young's modulus of the spacer as a whole.

In one embodiment, core 801 of the spacer is made from a cured thermoset polymer, such as cured silicone, cured polyurethane, cured epoxy, or other soft cured thermoset materials. To cure a thermoset polymer, thermoset monomers with curing agents are exposed to their curing temperatures and cured to a solid state. Once thermoset materials are cured, their physical properties become set and they can no longer be melted and do not have a melting temperature. But cured thermoset materials remain soft and, in some cases, softer than cured binder materials. Use of thermoset polymers can result in core 801 having a Young's modulus even lower than the Young's modulus of the cured binder. And because cured thermoset polymers do not melt, spacers 600 with core 801 made from cured thermoset polymers maintain their shape under high temperatures used to cure the binder component of the electrically conductive adhesive and therefore can maintain proper spacing between solar cells when solar cells are bonded together. A core 801 made from thermoset polymers may be covered in shell 802 made from an electrically conductive material such as silver.

This disclosure is illustrative and not limiting. Further modifications will be apparent to one skilled in the art in light of this disclosure and are intended to fall within the scope of the appended claims. For example, where methods and steps described above indicate certain events occurring in certain order, those of ordinary skill in the art will recognize that the ordering of certain steps may be modified, and that some steps may be omitted or additional steps added, and that such modifications are in accordance with the variations of the invention.

What is claimed is:

1. A device comprising:
    a string of solar cells comprising at least a first and second rectangular or substantially rectangular crystalline silicon solar cells arranged in a shingled manner with long sides of the first and second solar cells overlapping and conductively bonded to each other with an electrically conductive adhesive to electrically connect the first and second solar cells in series;
    each crystalline silicon solar cell comprising:
        a front surface having a front metallization pattern comprising a plurality of conductive fingers electrically connected to a plurality of front contact pads, and
        a rear surface having a rear metallization pattern comprising a plurality of rear contact pads;
    the electrically conductive adhesive comprising electrically conductive particles, a cured binder, and spacers, the spacers having an electrical conductivity greater than $1 \times 10^{-10}$ S/m and a Young's modulus less than or substantially equal to a Young's modulus of the cured binder; and
    the electrically conductive adhesive is in contact with one of the front contact pads of the first solar cell and one of the rear contact pads of the second solar cell and the spacers in the electrically conductive adhesive establishes a minimum distance between the front contact pad and the rear contact pad.

2. The device of claim 1, wherein the spacers have a melting temperature greater than 150° C.

3. The device of claim 1, wherein the spacers have a melting temperature greater than 200° C.

4. The device of claim 1, wherein the cured binder is cured epoxy.

5. The device of claim 1, wherein the electrically conductive particles in the electrically conductive adhesive comprise silver.

6. The device of claim 1, wherein the spacers have a size distribution with a coefficient of variation of a thickness of the spacers that is less than 10%.

7. The device of claim 1, wherein a weight of the spacers comprises between 2% and 5% a weight of the electrically conductive adhesive.

8. A device comprising:

a string of solar cells comprising at least a first and second rectangular or substantially rectangular crystalline silicon solar cells arranged in a shingled manner with long sides of the first and second solar cells overlapping and conductively bonded to each other with an electrically conductive adhesive to electrically connect the first and second solar cells in series;

each crystalline silicon solar cell comprising:
- a front surface having a front metallization pattern comprising a plurality of conductive fingers electrically connected to a plurality of front contact pads, and
- a rear surface having a rear metallization pattern comprising a plurality of rear contact pads;

the electrically conductive adhesive comprising electrically conductive particles, a cured binder, and spacers, the spacers having an electrical conductivity greater than $1 \times 10^{-10}$ S/m and a Young's Modulus of between 0.1 and 35 GPa; and the electrically conductive adhesive is in contact with one of the front contact pads of the first solar cell and one of the rear contact pads of the second solar cell and the spacers in the electrically conductive adhesive establishes a minimum distance between the front contact pad and the rear contact pad.

9. The device of claim 8, wherein the spacers have a melting temperature greater than 150° C.

10. The device of claim 8, wherein the Young's Modulus of the spacers is between 6 and 35 GPa.

11. The device of claim 8, wherein the electrically conductive particles in the electrically conductive adhesive comprise silver.

12. The device of claim 8, wherein the spacers have a size distribution with a coefficient of variation of a thickness of the spacers that is less than 10%.

* * * * *